(12) United States Patent
Wu et al.

(10) Patent No.: US 10,395,994 B1
(45) Date of Patent: Aug. 27, 2019

(54) EQUAL SPACER FORMATION ON SEMICONDUCTOR DEVICE

(71) Applicant: INTERNATIONAL BUSINESS MACHINES CORPORATION, Armonk, NY (US)

(72) Inventors: Heng Wu, Guilderland, NY (US); Juntao Li, Cohoes, NY (US); Peng Xu, Santa Clara, CA (US); Kangguo Cheng, Schenectady, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/911,838

(22) Filed: Mar. 5, 2018

(51) Int. Cl.
*H01L 21/8238* (2006.01)
*H01L 27/092* (2006.01)
*H01L 21/02* (2006.01)

(52) U.S. Cl.
CPC ........... *H01L 21/823864* (2013.01); *H01L 21/02532* (2013.01); *H01L 21/823814* (2013.01); *H01L 21/823821* (2013.01); *H01L 27/0924* (2013.01)

(58) Field of Classification Search
CPC ..... H01L 21/823814; H01L 21/823821; H01L 21/823864
See application file for complete search history.

(56) References Cited

U.S. PATENT DOCUMENTS

| | | | |
|---|---|---|---|
| 6,709,982 B1 | 3/2004 | Buynoski et al. | |
| 6,924,178 B2 | 8/2005 | Beintner | |
| 8,420,464 B2 | 4/2013 | Basker et al. | |
| 8,796,759 B2 | 8/2014 | Perng et al. | |
| 9,337,196 B2 | 5/2016 | Cheng et al. | |
| 9,450,095 B1* | 9/2016 | Bergendahl | ......... H01L 29/7848 |
| 9,601,381 B2 | 3/2017 | Loubet et al. | |
| 9,691,900 B2 | 6/2017 | Cheng et al. | |
| 2012/0077319 A1* | 3/2012 | Lee | ................. H01L 21/823425 438/229 |
| 2016/0148933 A1* | 5/2016 | Cheng | ................ H01L 29/7848 257/369 |
| 2017/0373063 A1* | 12/2017 | Bao | ..................... H01L 27/0924 |

* cited by examiner

*Primary Examiner* — Cuong Q Nguyen
*Assistant Examiner* — Peter M Albrecht
(74) *Attorney, Agent, or Firm* — Schmeiser, Olsen & Watts; Michael A. Petrocelli

(57) ABSTRACT

A method for fabricating a semiconductor device having a uniform spacer thickness between field-effect transistors (FETs) associated with regions of the device is provided. A first semiconductor material is epitaxially grown in a first source/drain region within a first region of the device associated with a first FET. A capping layer is selectively formed on the first semiconductor material by forming a layer over the first and second regions that reacts with the first semiconductor material to form the capping layer. A second semiconductor material is epitaxially grown in a second source/drain region within a second region of the device associated with a second FET. The capping layer caps the growth of the first semiconductor material during the epitaxial growth of the second semiconductor material to provide the uniform spacer thickness between the first and second FETs.

15 Claims, 11 Drawing Sheets

EQUAL SPACER FORMATION ON SEMICONDUCTOR DEVICE

BACKGROUND

Technical Field

The present invention generally relates to semiconductor structures and methods of manufacturing, and more particularly to field-effect transistor (FET) semiconductor devices.

Description of the Related Art

A field effect transistor (FET) is a semiconductor device in which the output current, i.e., source-drain current, is controlled by the voltage applied to the gate. A FinFET (fin field-effect transistor) is a nonplanar FET that includes a fin-shaped conducting channel on top of the substrate, thereby allowing multiple gates to operate on a single transistor. The thickness of the fin (e.g., measured from source to drain) determines the effective channel length of the FinFET device.

SUMMARY

In accordance with an embodiment of the present invention, a method for fabricating a semiconductor device having a uniform spacer thickness between field-effect transistors (FETs) associated with regions of the device is provided. The method includes epitaxially growing a first semiconductor material in a first source/drain region within a first region of the device associated with a first FET, selectively forming a capping layer on the first semiconductor material, including forming a layer over the first and second regions that reacts with the first semiconductor material to form the capping layer, and epitaxially growing a second semiconductor material in a second source/drain region within a second region of the device associated with a second FET. The capping layer caps the growth of the first semiconductor material during the epitaxial growth of the second semiconductor material to provide the uniform spacer thickness between the first and second FETs.

In accordance with another embodiment of the present invention, a method for fabricating a semiconductor device having uniform spacer thickness between field-effect transistors (FETs) associated with regions of the device. The method includes epitaxially growing a first semiconductor material including silicon germanium (SiGe) in a first source/drain region within a first region of the device associated with a first FET, selectively forming a capping layer including silicon dioxide ($SiO_2$) on the first semiconductor material, including forming a layer over the first and second regions that reacts with the first semiconductor material to form the capping layer, and epitaxially growing a second semiconductor material in a second source/drain region within a second region of the device associated with a second FET. The capping layer caps the growth of the first semiconductor material during the epitaxial growth of the second semiconductor material to provide the uniform spacer thickness between the first and second FETs.

In accordance with yet another embodiment of the present invention, a semiconductor device having a uniform spacer thickness between field-effect transistors (FETs) associated with regions of the device is provided. The device includes a first region associated with a first FET and including a first semiconductor material formed in a first source/drain region, a second region associated with a second FET and including a second semiconductor material formed in a second source/drain region, and a capping layer formed on the first semiconductor material that provides the uniform spacer thickness between the first and second FETs.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
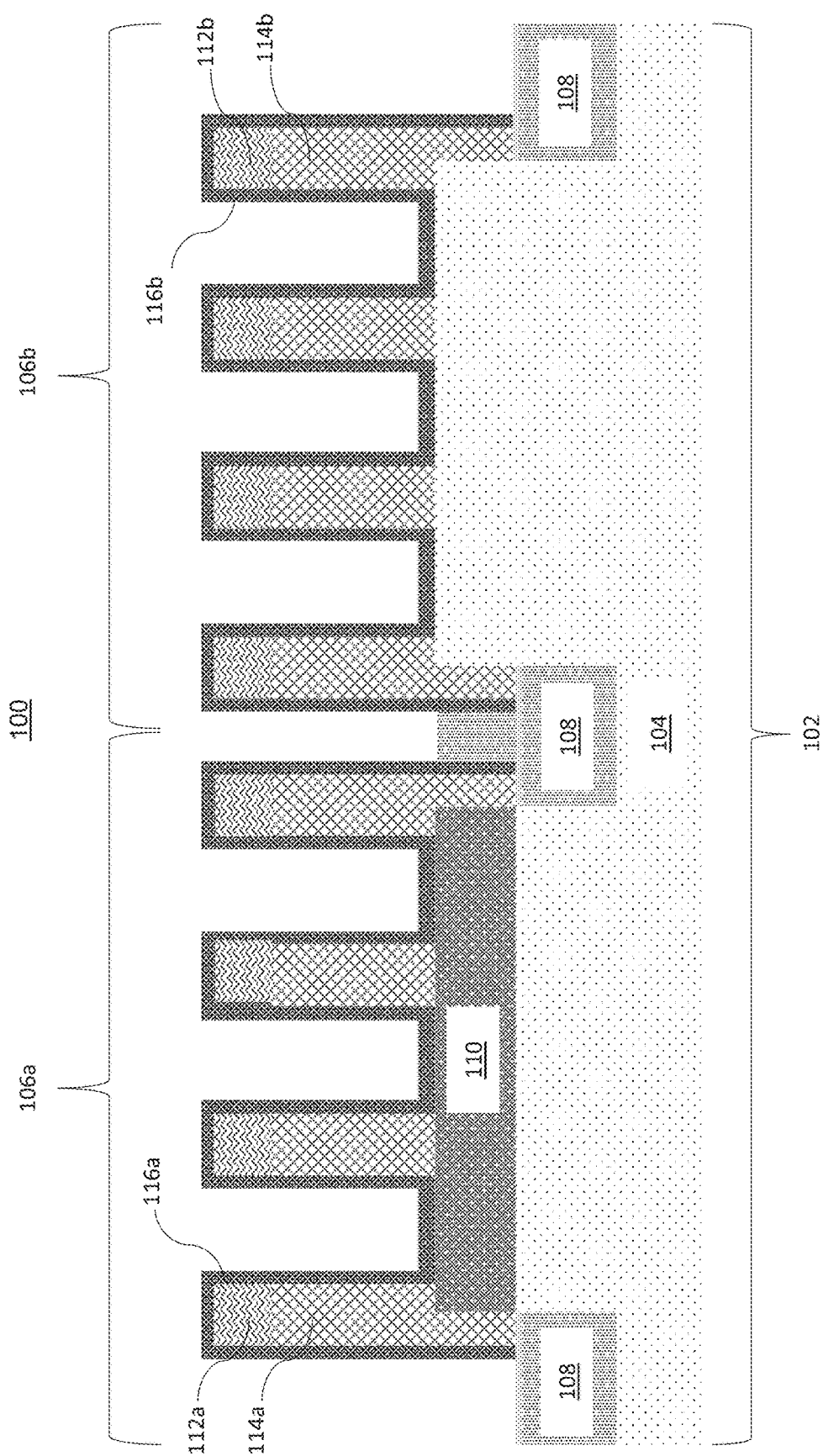
FIG. 1 is a cross-sectional view showing the formation of first and second spacer layer in respective first and second regions during the fabrication of a semiconductor device, in accordance with an embodiment of the present invention.

A semiconductor device can have one or more FETs in one or more corresponding regions of the device. In the case of a device with multiple FETs, one or more of the FETs can be of different types. In current FinFET technology, the spacer thicknesses between FETs of the device can be different. For example, in an illustrative embodiment in which the device includes an n-type FET (nFET) in one region and a p-type FET (pFET) in another region, the spacer thickness between the nFET and the pFET can be different. The different spacer thicknesses among the FETs can induce unsymmetrical device performance, which is undesirable for circuit design and optimization. For example, an extra spacer on either an nFET or a pFET can cause performance degradation.

Embodiments of the present invention provide for the fabrication of a semiconductor device that implements uniform spacer scheme in forming the components of the device, thereby improving performance of the device. For example, the components of the device, which can include a first FET of a first type and a second FET of a second type (e.g., an nFET and a pFET), can be fabricated to have uniform or substantially uniform spacer thickness (e.g., within approximately a 1-2 nm variation range) by using a technique that selectively forms a capping material from material epitaxially grown in source/drain regions of the first FET (first FET epitaxy). The capping material is formed to cap the growth of the first FET epitaxy during the epitaxial growth of material in the second FET (second FET epitaxy). The process described herein is a cost-effective semiconductor device fabrication scheme, since it at least saves a replacement gate mask.

To illustrate this concept, as will be further described below, the capping material can, in one embodiment, include silicon dioxide ($SiO_2$). If the material epitaxially grown in the source/drain regions of the first FET includes silicon germanium (SiGe), germanium dioxide ($GeO_2$) can be deposited on the SiGe to selectively form the $SiO_2$ of the capping material. In this illustrative embodiment, the capping material caps the growth of the SiGe during the growth of the second FET epitaxy (e.g., capping growth on a pFET epitaxy during growth of an nFET epitaxy). The second FET epitaxy can include silicon phosphide (SiP).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $SixGe_1$-x where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, FIGS. 1-9 depict respective steps of a process for fabricating a semiconductor device 100.

Referring to FIG. 1, the device can include two or more regions, including a region 106a and a region 106b, formed from a substrate 102. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

In this illustrative example, substrate 102 includes a base material 104. In one embodiment, base material 104 includes silicon (Si). The substrate 102 can be fabricated using one or more techniques known to those skilled in the art.

The regions of the device 100 can be separated by shallow trench isolation (STI) regions 108 formed in the substrate 102. The STI regions 108 can be formed by etching a trench in the substrate 102 utilizing a conventional dry etching process such as reactive-ion etching (RIE) or plasma etching. The trenches may optionally be lined with a conventional liner material, e.g., an oxide, and then CVD or another like deposition process is used to fill the trench with polysilicon or another like STI dielectric material. The STI dielectric material may optionally be densified after deposition. A conventional planarization process such as chemical-mechanical polishing (CMP) may optionally be used to provide a planar structure.

Regions 106a and 106b are associated with respective devices formed on the substrate 102. In one embodiment, region 106a is associated with a FET of a first type and device region 106b is associated with a FET of a second type. For example, the FET of the first type could be a pFET and the FET of the second type could be an nFET.

In region 106a, as shown, a layer 110 is formed in the substrate 102. In one embodiment, the layer 110 includes silicon germanium (SiGe).

Fin structures are formed from the substrate 102 in regions 106a and 106b, respectively. The fin structures can be formed from the substrate using photolithography and etch processes. For example, prior to etching the substrate 102 to provide the fin structures, a layer of dielectric material can deposited atop the substrate 102 that will provide caps. The dielectric material can include a nitride, oxide, oxynitride material, and/or any other suitable dielectric layer. The dielectric material can include a single layer of dielectric material or multiple layers of dielectric materials. The dielectric material can be formed by a deposition process, such as chemical vapor deposition (CVD) and/or atomic layer deposition (ALD). Alternatively, the dielectric material may be formed using a growth process, such as thermal oxidation or thermal nitridation. The dielectric material can have a thickness ranging from 1 nm to 100 nm. In one example, the caps include an oxide, such as $SiO_2$, that is formed by CVD to a thickness ranging from 25 nm to 50 nm.

In one embodiment, following the formation of the dielectric material, a photolithography and etch process sequence is applied to the substrate 102 and the dielectric material that will provide the caps. For example, a photoresist mask can be formed such that the portion of the dielectric material that is underlying the photoresist mask provides the caps, and the portion of the substrate 102 that is underlying the photoresist mask provides the fin structures. The exposed portions of the dielectric material that provides the caps and the substrate 102, which are not protected by the photoresist mask, are removed using a selective etch process. To provide the photoresist mask, a photoresist layer is first positioned on the dielectric material that provides the caps. The photoresist layer may be provided by a blanket layer of photoresist material that is formed utilizing a deposition process such as, for example, CVD, plasma-enhanced CVD, evaporation or spin-on coating. The blanket layer of photoresist material can then be patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the dielectric material that provides the caps, including cap 112a formed in region 106a and cap 112b formed in region 106b, followed by removing the unprotected portion of the substrate 102 to form the fin structures, including fin structure 114a formed in region 106a and fin structure 114b formed in region 106b. For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation.

In this illustrative embodiment, each region 106 and 106b includes four fin structures. However, any number of fin structures can be formed in each region 106a and 106b in accordance with the embodiments described herein. Accordingly, the number of fin structures depicted herein should not considered limiting.

The device 100 further includes spacer layer 116a and spacer layer 116b. The spacer layer 116a is shown formed on the STI region 108, the layer 110, the cap 112a, and the fin structure 114a. The spacer layer 116b is shown formed on the base material 104, the STI region 108, the cap 112b, and the fin structure 114b. The spacer layers 116a and 116b can be formed by conformally depositing a material suitable for use as spacer material (e.g., a dielectric material). For example, the spacer layers 116a and 116b can be formed by conformally depositing an oxide, nitride or oxynitride. In one embodiment, the spacer layers 116a and 116b include silicoboron carbonitride (SiBCN).

Figure 2:
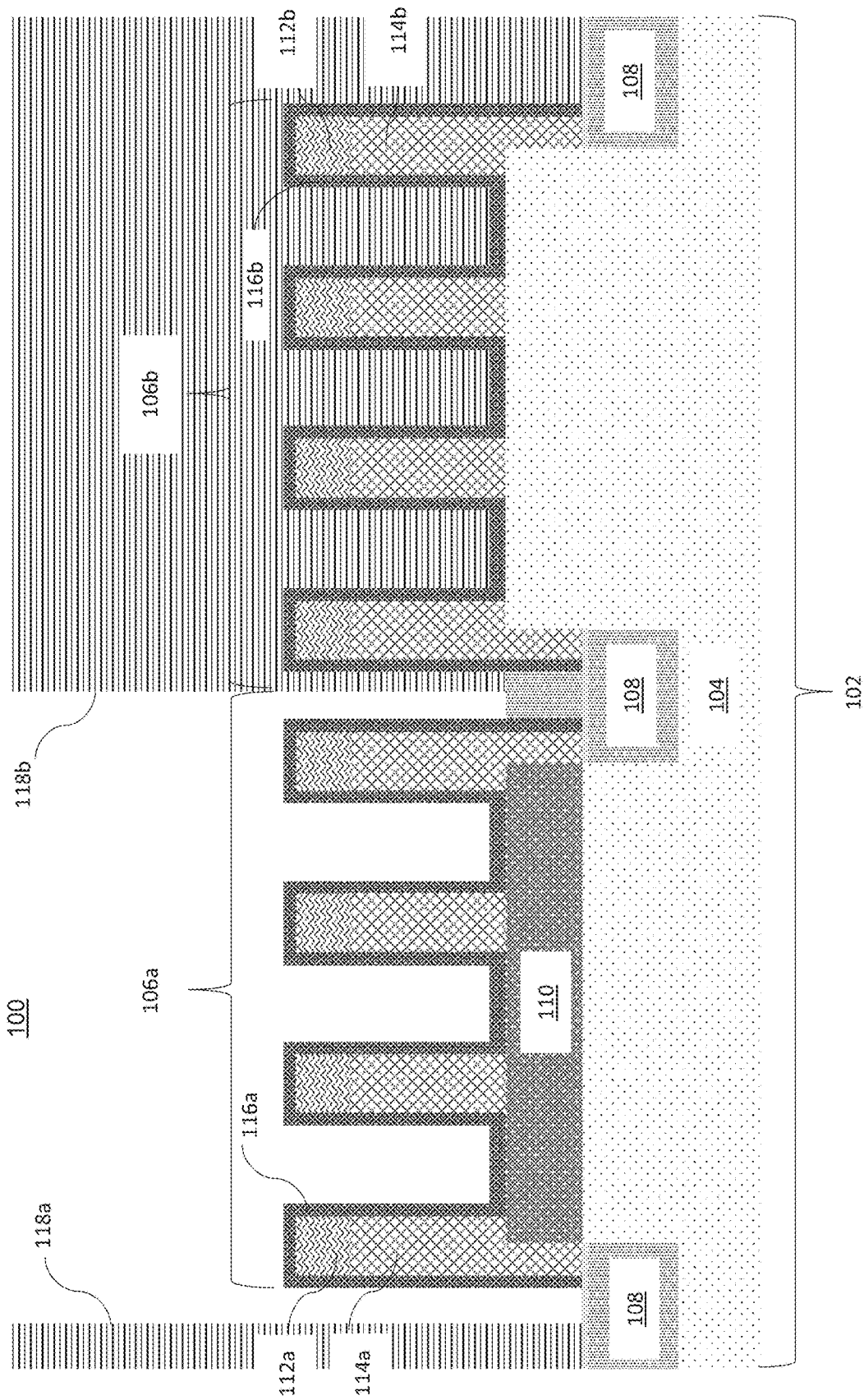
FIG. 2 is a cross-sectional view showing the formation of a mask during the fabrication of the semiconductor device, in accordance with an embodiment of the present invention.

Referring to FIG. 2, a mask 118a is formed in region 106a and a mask 118b is formed in region 106b. The masks 118a and 118b protect portions of the spacer layers 116a and 116b, respectively, from a subsequent etch process. The masks 118a and 118b can include any material suitable for use in accordance with the embodiments described herein.

Figure 3:
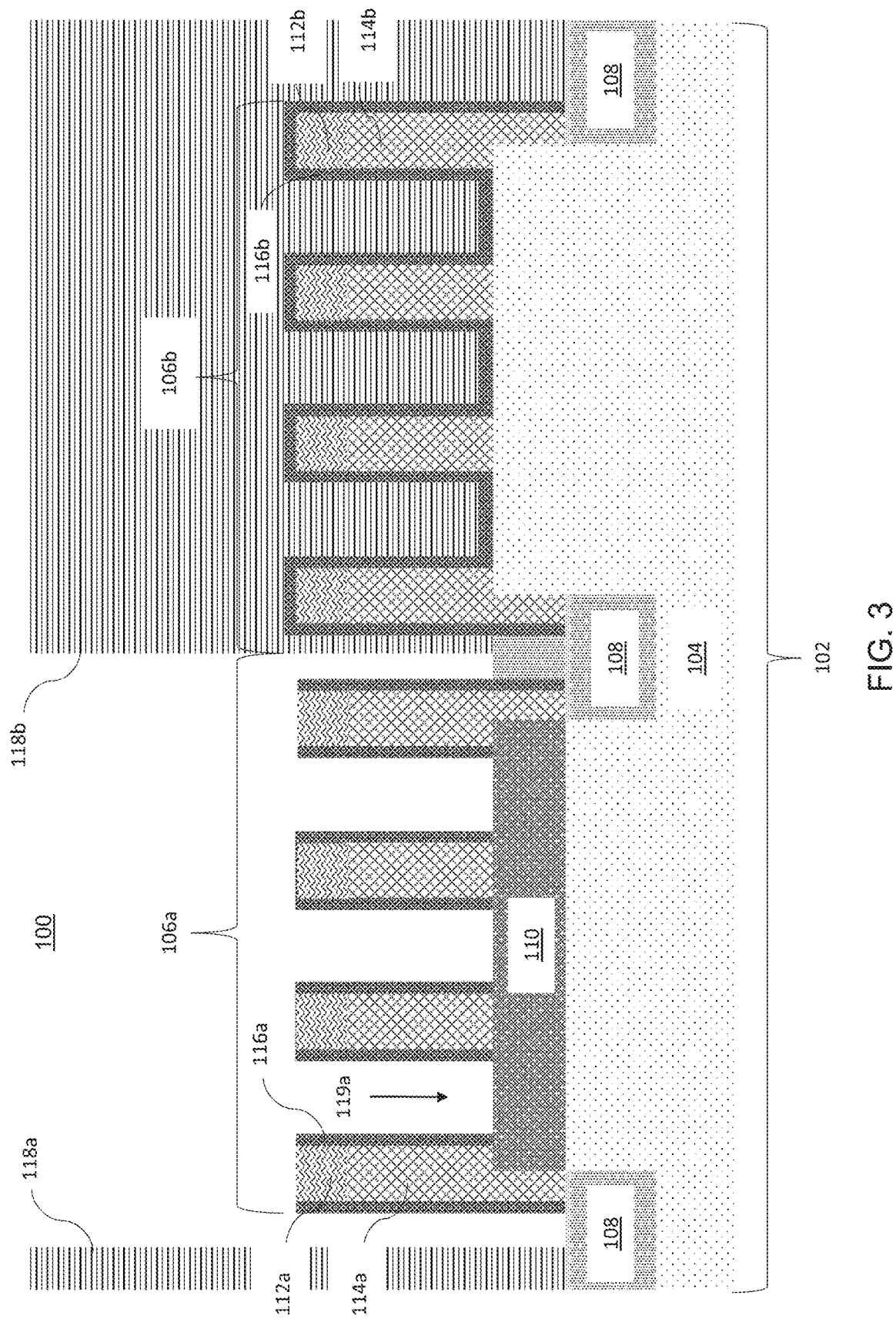
FIG. 3 is a cross-sectional view showing the removal of portions of the first spacer layer to open source/drain regions within the first region during the fabrication of the semiconductor device, in accordance with an embodiment of the present invention.

Referring to FIG. 3, an etch process is performed to remove portions of the spacer layer 116a to open source drain regions in region 106a, including a source/drain region 119a. As shown, the etch process removes the portions of the spacer layer 116a corresponding to the surface of the caps in region 106a (e.g., the cap 112a) and the exposed surface of the layer 110. In one embodiment, performing the etch process includes performing reactive-ion etching (RIE).

Figure 4:
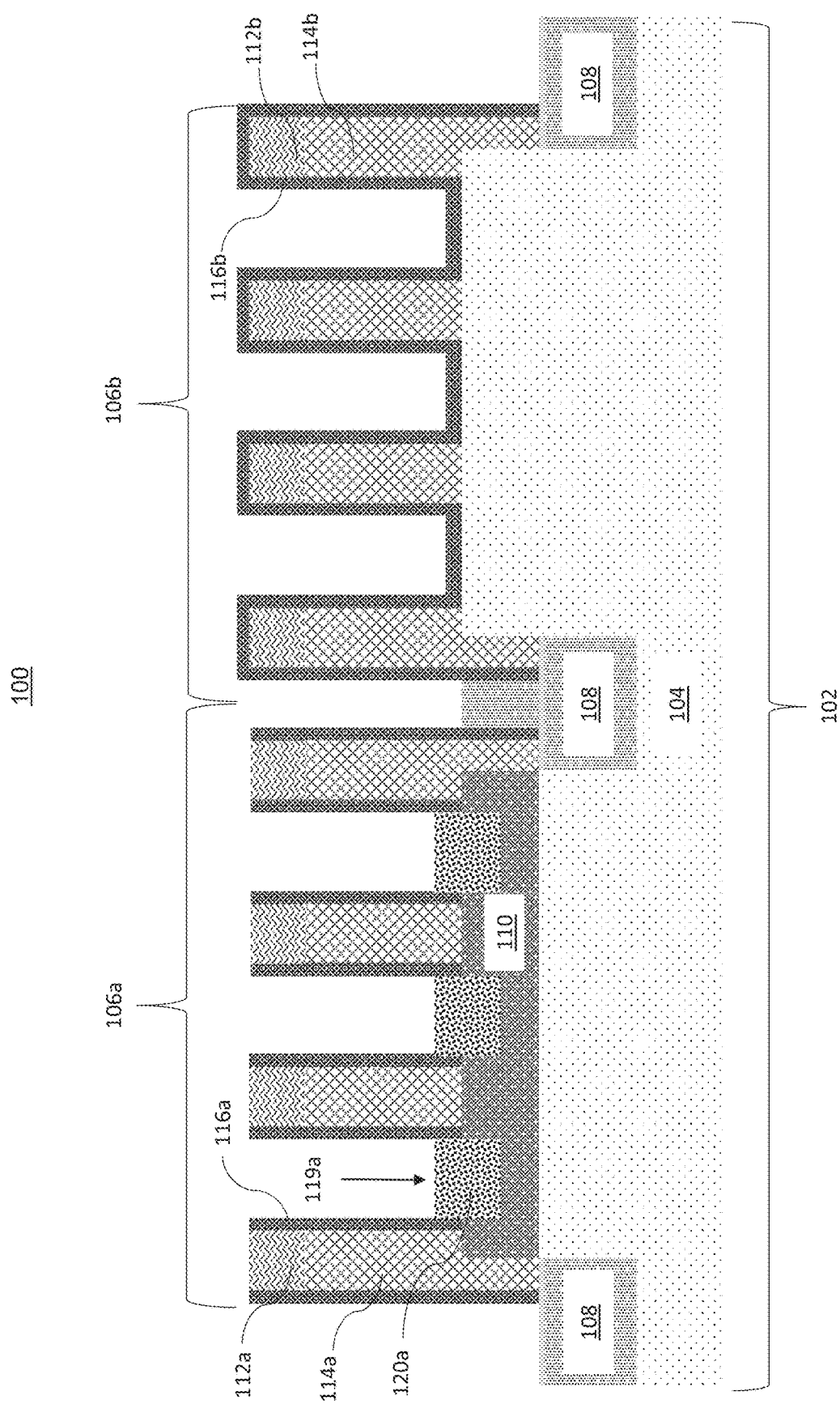
FIG. 4 is a cross-sectional view showing epitaxial growth of a first semiconductor material during the fabrication of the semiconductor device, in accordance with an embodiment of the present invention.

Referring to FIG. 4, the masks 118a and 118b are removed, and semiconductor material is epitaxially grown from the layer 110 within the source/drain regions, including semiconductor material 120a grown in source/drain region 119a.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a (100) crystal surface will take on a (100) orientation. Accordingly, in the embodiment where layer 110 includes SiGe, the semiconductor material 120a includes SiGe.

Figure 5:
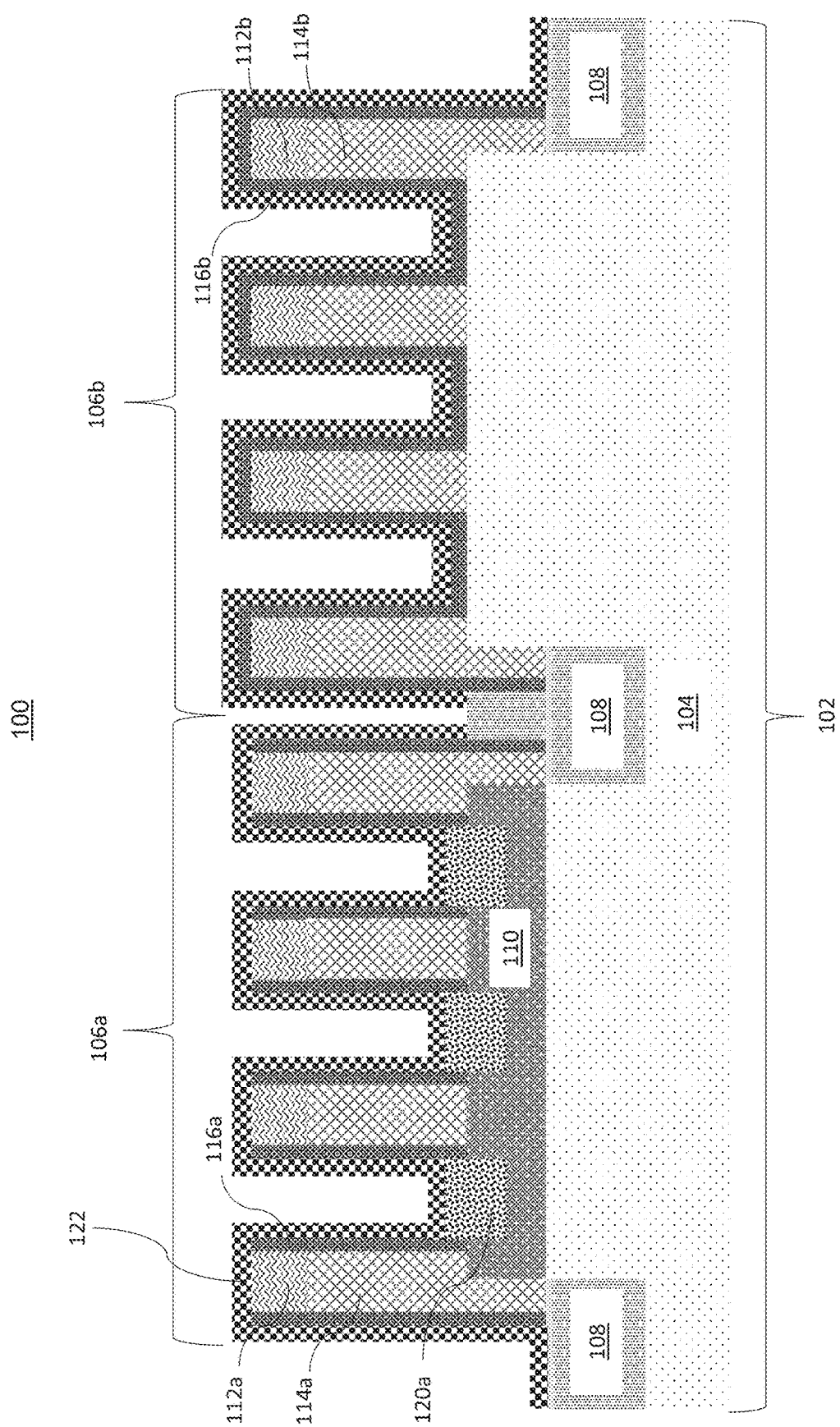
FIG. 5 is cross-sectional view showing formation of a layer on the first semiconductor material.

Referring to FIG. 5, a layer 122 is formed in the regions 106a and 106b. The layer 122 includes a material that can react with the semiconductor material 120a to selectively form a capping layer on the semiconductor material 120a. In the embodiment in which the semiconductor material 120a includes SiGe, the layer 122 can include $GeO_2$. The layer 122 can be formed by conformal deposition.

Figure 6:
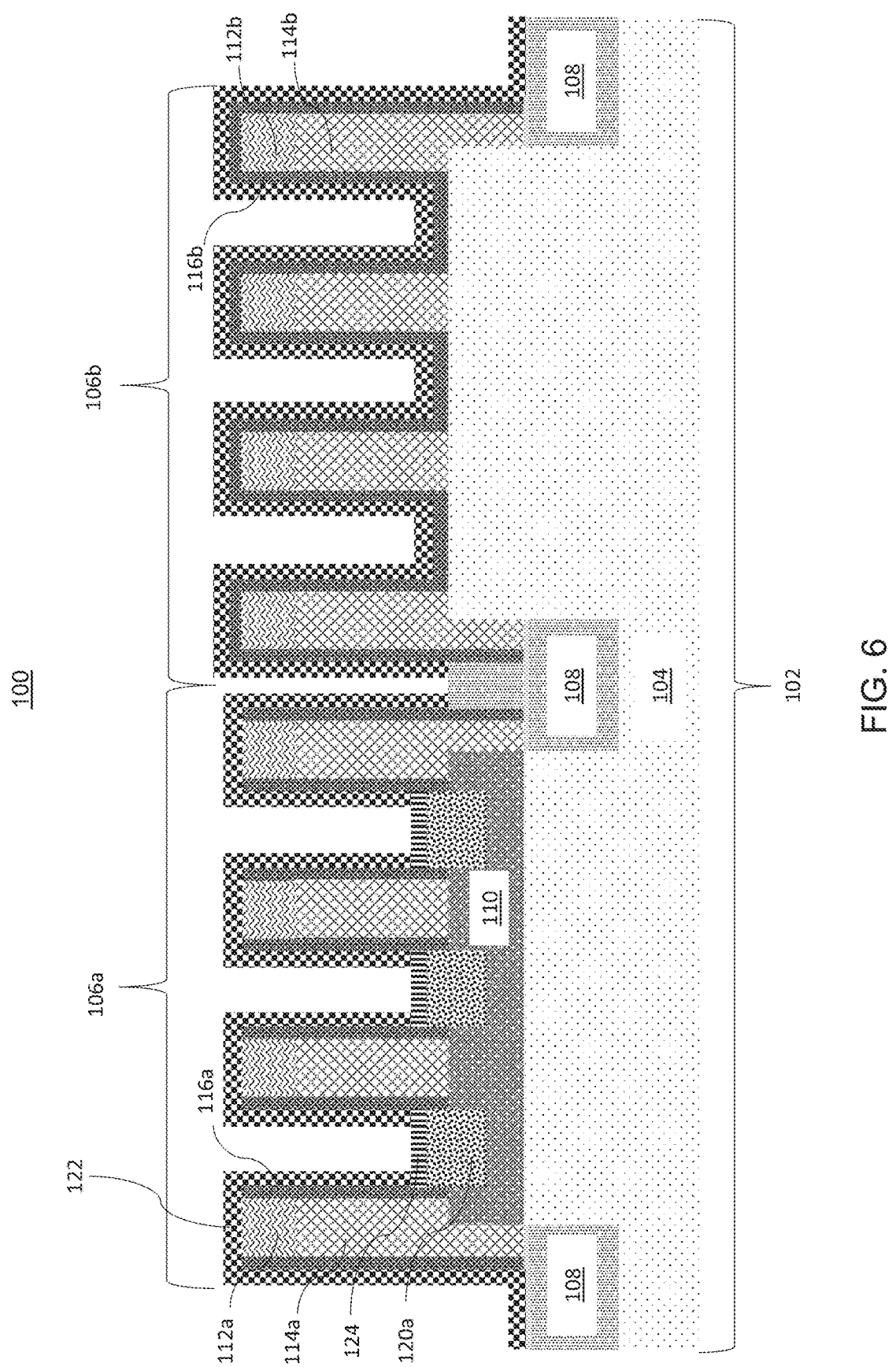
FIG. 6 is a cross-section view showing the selective formation of capping layers on the first semiconductor material during the fabrication of the semiconductor device, in accordance with an embodiment of the present invention.

Referring to FIG. 6, a capping layer 124 is formed on the semiconductor material 120a. In the embodiment in which the semiconductor material 120a includes SiGe and the layer 122 includes $GeO_2$, the capping layer 124 includes $SiO_2$. The reaction forming the $SiO_2$ occurs by performing an anneal process (e.g., a low temperature anneal process). An example of an equation governing this reaction is $Si+Ge+2 GeO_2 \rightarrow Ge+2GeO+SiO_2$. Accordingly, the Si from the SiGe is selectively oxidized, which is due to the lower Gibbs free energy.

Figure 7:
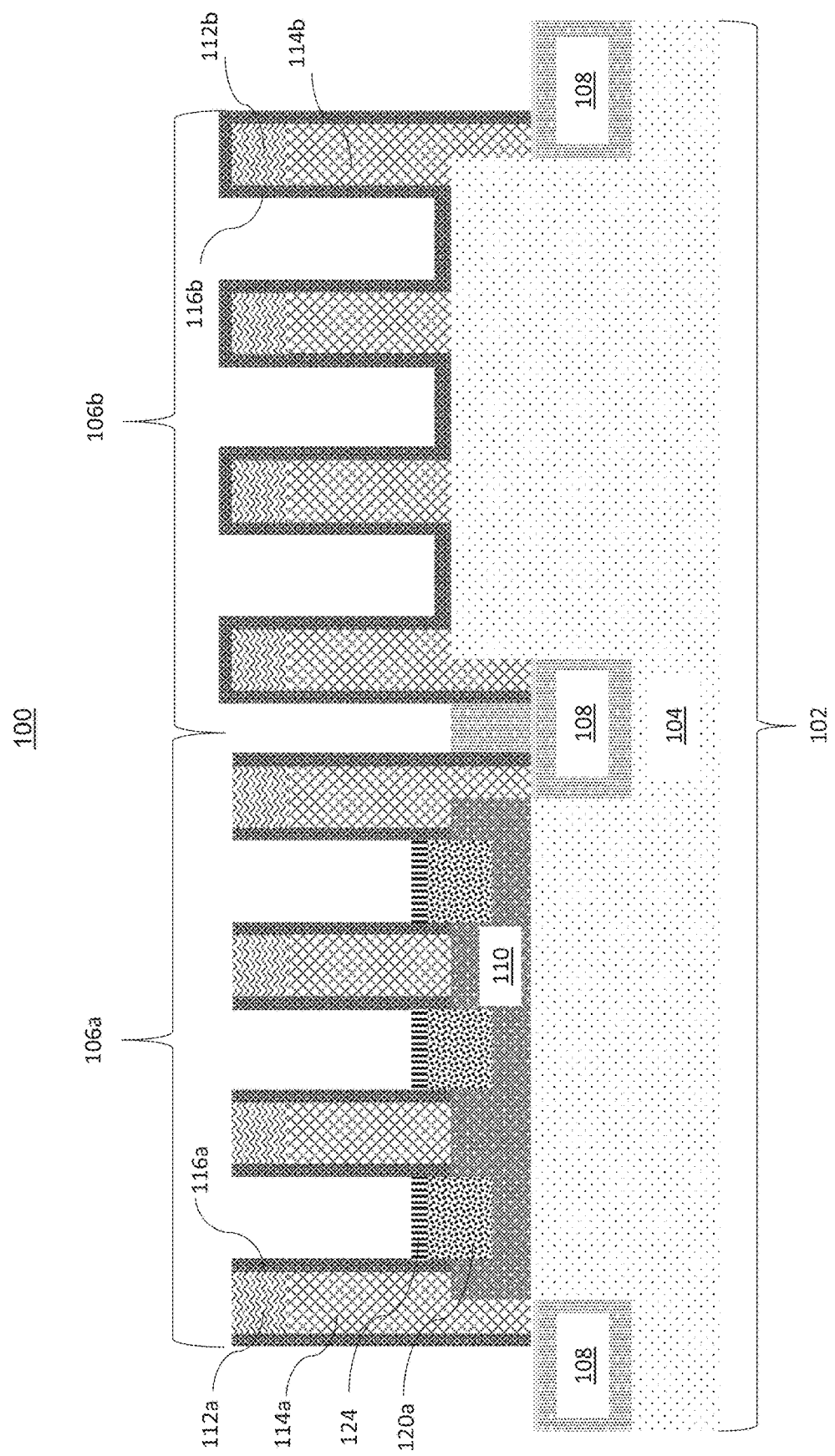
FIG. 7 is a cross-sectional view showing the removal of the layer during the fabrication of the semiconductor device, in accordance with an embodiment of the present invention.

Referring to FIG. 7, now that the capping layer 124 has been formed, the layer 122 remaining after the capping layer 124 is formed is removed from the regions 106a and 106b. In the embodiment in which the layer 122 includes $GeO_2$, due to the properties of $GeO_2$, the layer 122 can be removed by performing a deionized (DI) water rinse. The DI water rinse can be performed at room temperature (e.g., at a temperature from about 15 degrees Celsius to about 25 degrees Celsius).

The material of the capping layer 124 should have etch selectivity to the material of the spacer layers 116a and 116b. For example, in the embodiment in which the capping layer 124 includes $SiO_2$, the spacer layers 116a and 116b can include SiBCN. The etch selectivity of $SiO_2$ to SiBCN can be used to open source/drain regions in region 106b such that the material formed in the source/drain regions in region 106a (e.g. the semiconductor material 120a) remains intact without additional patterning needed.

Figure 8:
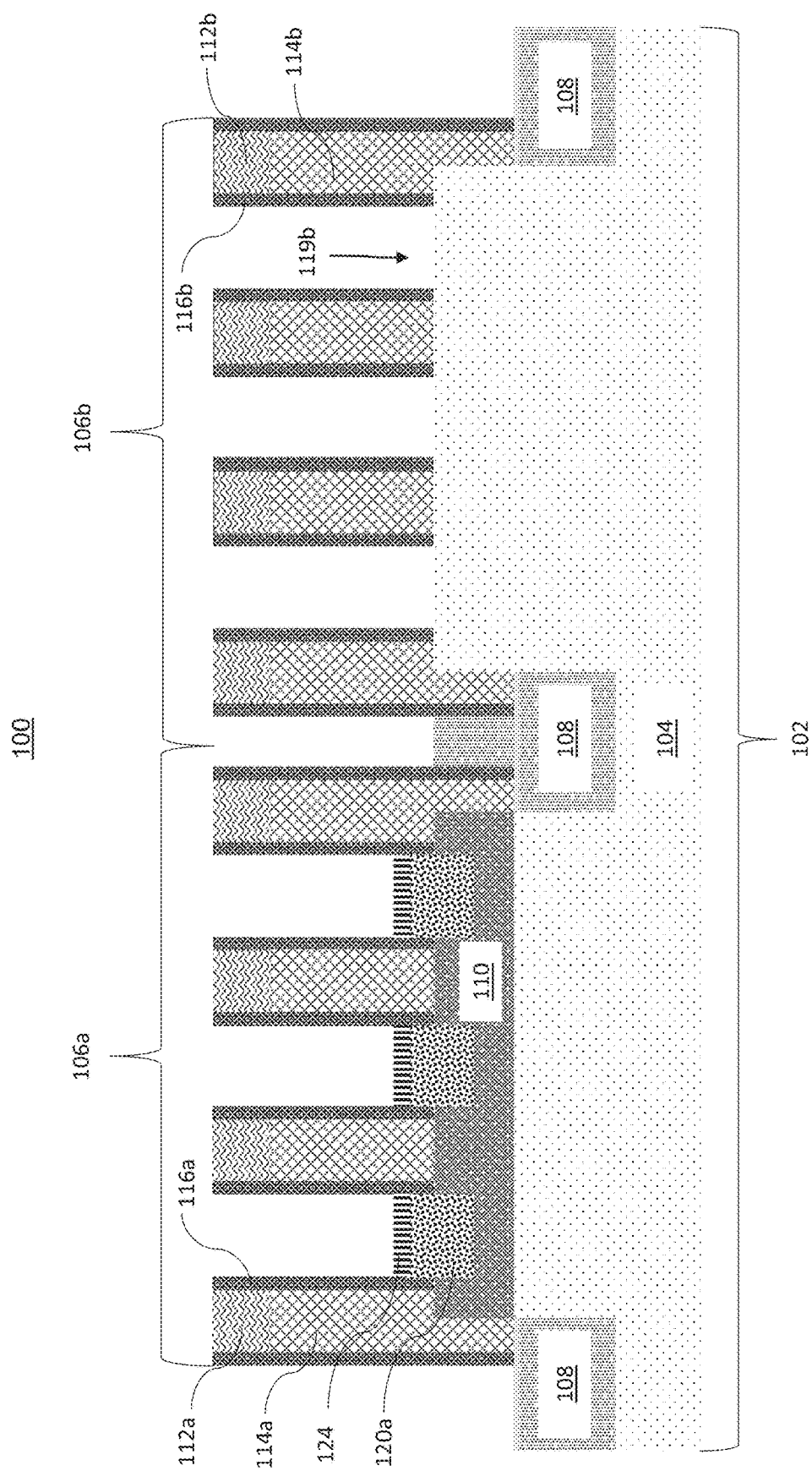
FIG. 8 is a cross-sectional view showing the removal portions of the second spacer layer to open source/drain regions within the second region during the fabrication of the semiconductor device, in accordance with an embodiment of the present invention.

Referring to FIG. 8, portions of the spacer layer 116b are selectively removed to open the source/drain regions in region 106b, including source/drain region 119b. As shown, the portions correspond to the top of the caps (e.g., the top of the cap 112b), and the surface of the substrate 102 between the fins in the region 106b. In one embodiment, the portions of the spacer layer 116b are removed using an etch process, such as RIE.

Figure 9:
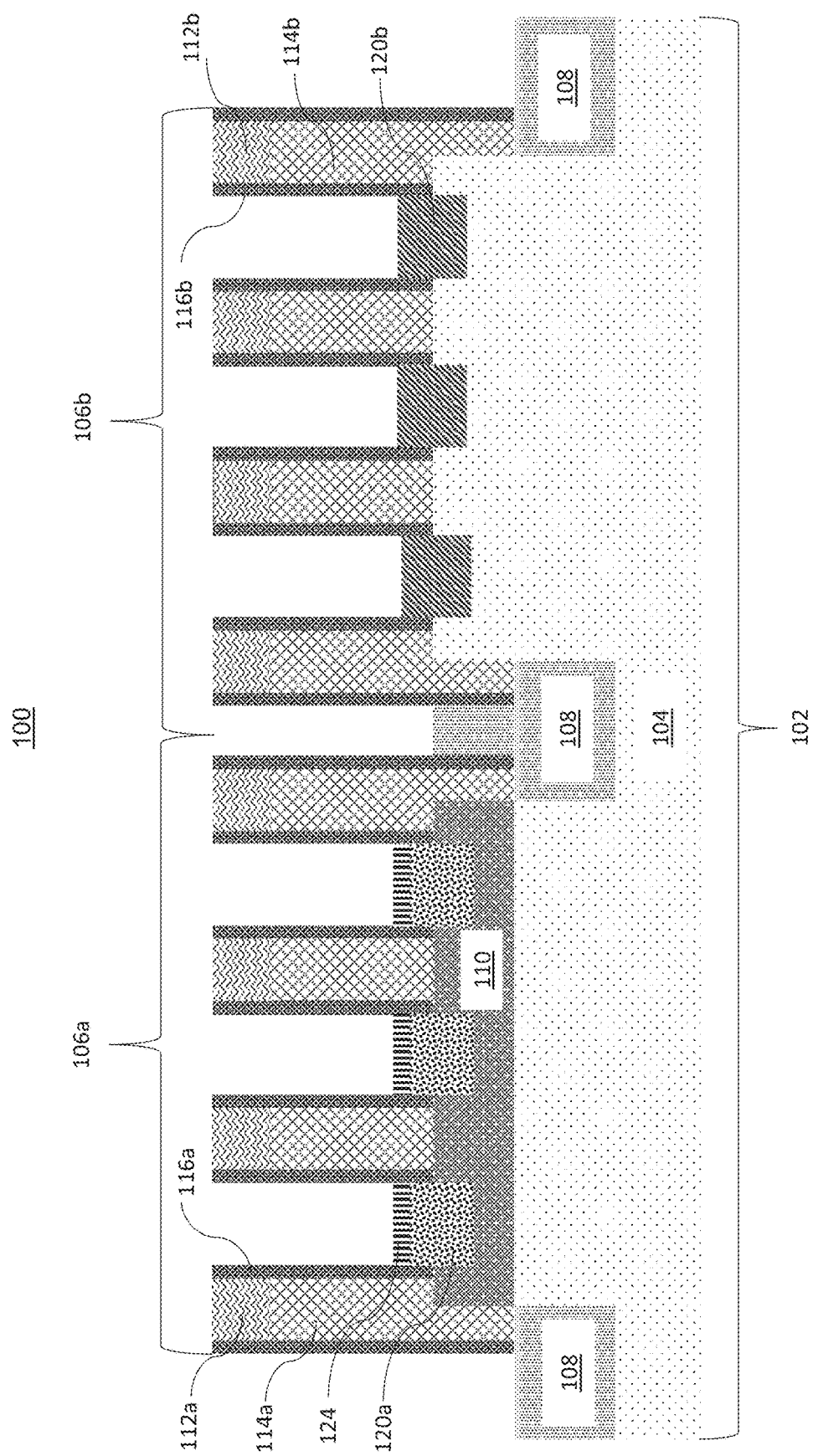
FIG. 9 is a cross-sectional view showing epitaxial growth of a second semiconductor material during the fabrication of the semiconductor device, in accordance with an embodiment of the present invention.

Referring to FIG. 9, a semiconductor material is epitaxially grown in the source/drain regions of the region 106b, including a semiconductor material 120b formed in the source/drain region 119b. In one embodiment, the semiconductor material formed in the region 106b includes SiP. The capping layers (e.g., capping layer 124) cap the growth of the semiconductor material in the source/drain regions of the region 106a during the growth of the semiconductor material in the source/drain regions of the region 106b, thereby providing substantially uniform spacer thickness between the devices being formed in the regions 106a and 106b.

Figure 10:
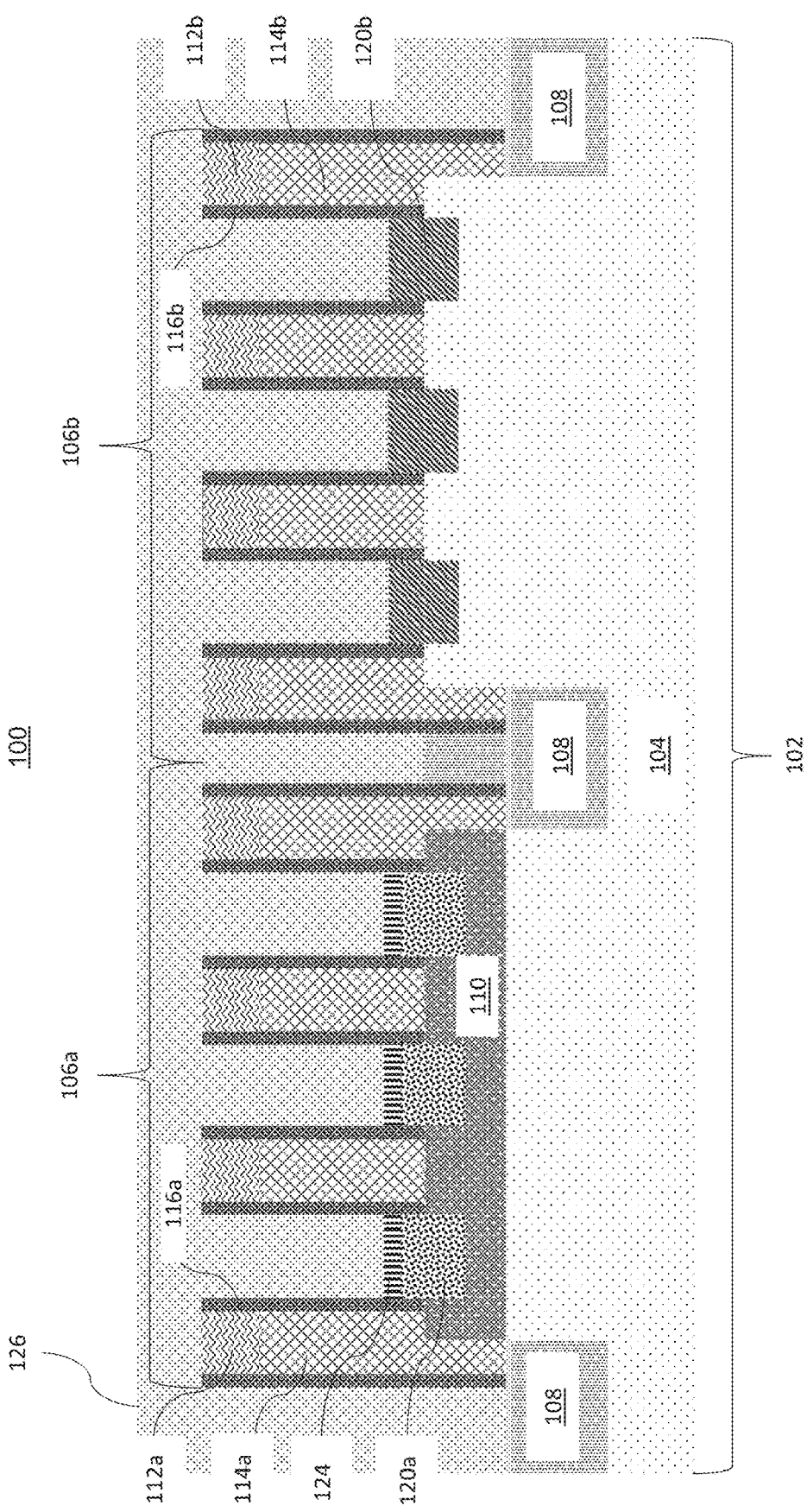
FIG. 10 is a cross-sectional view showing formation of an interlevel dielectric during the fabrication of the semiconductor device, in accordance with an embodiment of the present invention.

Referring to FIG. 10, further downstream processing can be performed on the device 100. For example, an interlevel dielectric (ILD) layer 126 can formed within the regions 106a and 106b. The ILD layer 126 may be formed by any suitable deposition method known in the art, such as, for example, CVD of a dielectric material suitable for use as material for an ILD layer.

Figure 11:
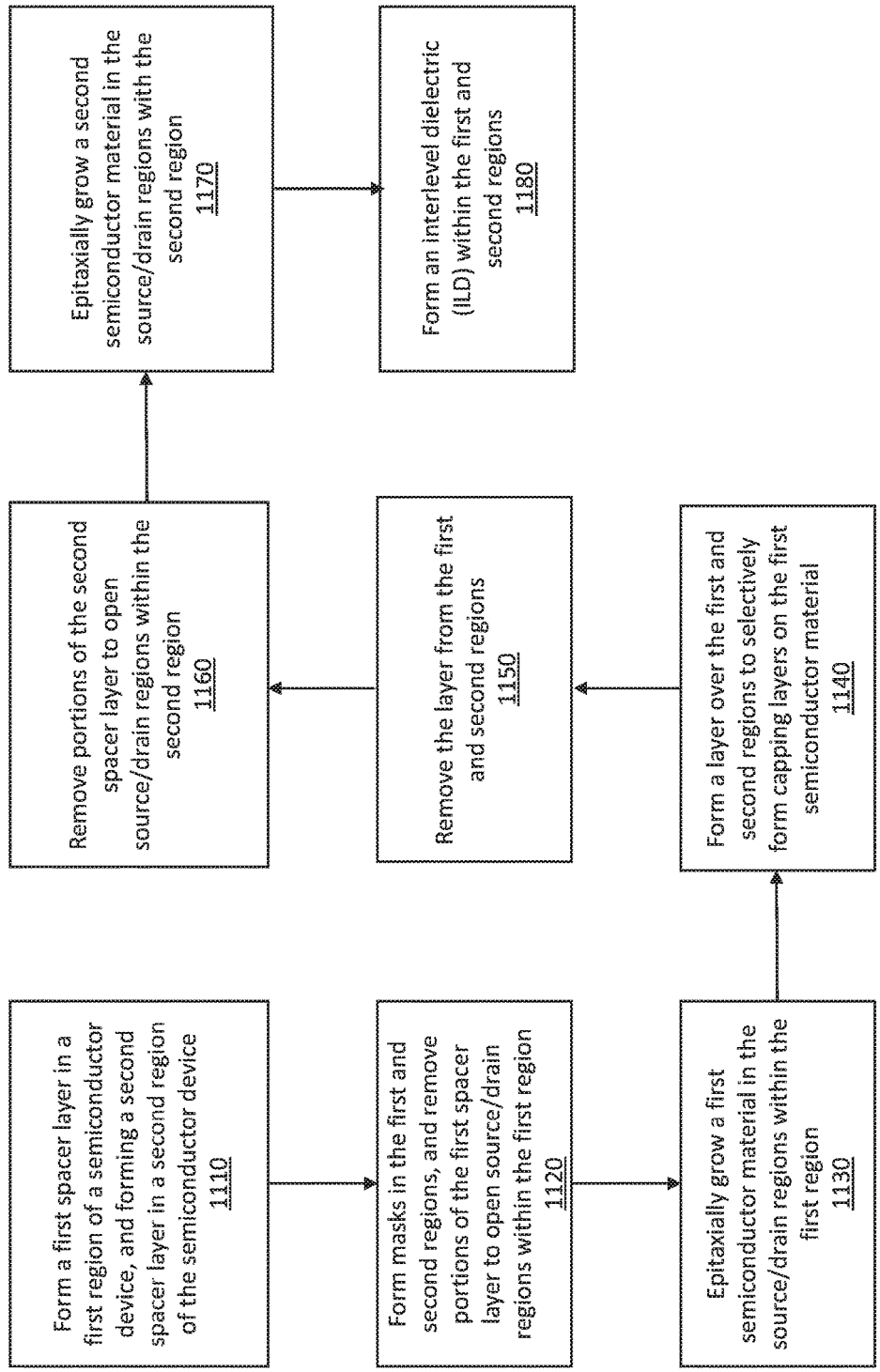
FIG. 11 is a block/flow diagram showing a system/method for fabricating a semiconductor device, in accordance with an embodiment of the present invention.

Referring to FIG. 11, a block/flow diagram 1100 is provided illustrating an exemplary process flow for fabricating a semiconductor device.

At block 1110, a first spacer layer is formed in a first region of a semiconductor device and a second spacer layer is formed in a second region of the semiconductor device. The first and second spacer layers can be formed from any material suitable for use in accordance with the embodiments described herein (e.g., a dielectric material). In one embodiment, at least one of the first and second spacer layers includes SiBCN.

At block 1120, masks are formed in the first and second regions, and portions of the first spacer layer are removed to open source/drain regions within the first region. In one embodiment, the portion of the first spacer layer is removed utilizing RIE. However, any process can be used to remove the portion of the first spacer layer to open the first source/drain region, in accordance with the embodiments described herein.

At block 1130, a first semiconductor material is epitaxially grown in the first source/drain region. In one embodiment, the first semiconductor material includes SiGe epitaxially grown from a SiGe layer formed within the first region.

At block 1140, a layer is formed over the first and second regions. The portions of the layer formed over the first semiconductor material selectively form capping layers on the first semiconductor material. For example, in the embodiment in which the first semiconductor material includes SiGe, the layer formed over the first and second regions can include $GeO_2$, and an anneal process can be performed in order to selectively form capping layers including $SiO_2$ on the first semiconductor material. An example of an equation governing this reaction is $Si+Ge+2 GeO_2 \rightarrow Ge+2GeO+SiO_2$. Accordingly, the Si from the SiGe is selectively oxidized, which is due to the lower Gibbs free energy.

The choice of a semiconductor material including SiGe, a layer including $GeO_2$ and a capping layer including $SiO_2$ is purely exemplary, and other combinations of semiconductor materials and layers formed thereon that can be used to selectively form other types of capping layers in accordance with the embodiments described herein may be apparent to one skilled in the art. Thus, the choice of a first semiconductor material including SiGe and a layer including $GeO_2$ to selectively form capping layers including $SiO_2$ should not be considered limiting.

The capping layers are formed from the first semiconductor material at block 1140 so that a first FET being formed in the first region of the semiconductor device (e.g., pFET) and a second FET being formed in the second region of the semiconductor device (e.g., nFET) have a substantially similar spacer thickness to improve the performance of the semiconductor device by substantially eliminating unsymmetrical device performance.

Now that the capping layers have been formed in the first region, device processing can now continue in the second region. At block 1150, the layer formed at block 1140 to selectively form the capping layers is removed from the first and second regions. In the embodiment in which the layer includes $GeO_2$, due to the properties of $GeO_2$, the $GeO_2$ can be removed by performing a deionized (DI) water rinse. The DI water rinse can be performed at room temperature (e.g., at a temperature from about 15 degrees Celsius to about 25 degrees Celsius).

At block 1160, portions of the second spacer layer are removed to open second source/drain regions within the second region. In one embodiment, the portions of the second spacer layer are removed utilizing RIE. However, any process can be used to remove the portions of the second spacer layer to open the second source/drain regions, in accordance with the embodiments described herein.

The capping layers preferably have etch selectivity to the first and second spacer layers. In the embodiment in which the first and second spacer layers include SiBCN and the capping layer includes $SiO_2$, the etch selectivity of $SiO_2$ to SiBCN can be used to open the source/drain regions in the first region such that the first material remains intact without additional patterning needed.

At block 1170, a second semiconductor material is epitaxially grown in the second source/drain region. In one embodiment, the second semiconductor material includes silicon phosphide (SiP). The capping layers cap the growth of the first semiconductor material during the formation of the second semiconductor material.

At block 1180, further downstream processing is performed. For example, an ILD layer can be formed within the first and second regions. The ILD layer may be formed by any suitable deposition method known in the art, such as, for example, CVD of a dielectric material.

Having described preferred embodiments of a system and method for fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device having field-effect transistors (FETs) associated with regions of the device, comprising:
   epitaxially growing a first semiconductor material in a first source/drain region within a first region of the device associated with a first FET;
   selectively forming a capping layer on the first semiconductor material, including forming a layer over the first region and a second region of the device associated with a second FET that reacts with the first semiconductor material to form the capping layer; and
   epitaxially growing a second semiconductor material in a second source/drain region within the second region of the device, the capping layer capping the growth of the first semiconductor material during the epitaxial growth of the second semiconductor material.

2. The method of claim 1, wherein the capping layer includes silicon dioxide ($SiO_2$).

3. The method of claim 2, wherein the first semiconductor material includes silicon germanium (SiGe) and the layer formed over the first and second regions includes germanium dioxide ($GeO_2$).

4. The method of claim 3, wherein selectively forming the capping layer further comprises performing an anneal process to cause the first semiconductor material to react with the layer.

5. The method of claim 1, further comprising:
   forming a first spacer layer in the first region and a second spacer layer in the second region; and
   removing a portion of the first spacer layer to open the first source/drain region prior to epitaxially growing the first semiconductor material.

6. The method of claim 1, further comprising removing the layer formed over the first and second regions from the first and second regions after the capping layer is formed.

7. The method of claim 6, wherein the layer is removed by employing a deionized (DI) water rinse.

8. The method of claim 5, further comprising removing a portion of the second spacer layer to open the second source/drain region, and epitaxially growing the second semiconductor material in the second source/drain region.

9. The method of claim 1, wherein the first FET includes a pFET and the second FET includes an nFET.

10. A method for fabricating a semiconductor device having field-effect transistors (FETs) associated with regions of the device, comprising:
    epitaxially growing a first semiconductor material including silicon germanium (SiGe) in a first source/drain region within a first region of the device associated with a first FET;
    selectively forming a capping layer including silicon dioxide ($SiO_2$) on the first semiconductor material, including forming a layer including germanium dioxide (GeO$_2$) over the first region and a second region of the device associated with a second FET, and performing an anneal process to cause the SiGe to react with the GeO$_2$ to form the SiO$_2$; and epitaxially growing a second semiconductor material in a second source/drain region within the second region of the device, the capping layer capping the growth of the first semiconductor material during the epitaxial growth of the second semiconductor material.

11. The method of claim 10, further comprising:

forming a first spacer layer in the first region and a second spacer layer in the second region; and removing a portion of the first spacer layer to open the first source/drain region prior to epitaxially growing the first semiconductor material.

12. The method of claim 10, further comprising removing the layer including GeO$_2$ from the first and second regions after the capping layer is formed.

13. The method of claim 12, wherein the layer including GeO$_2$ is removed by employing a deionized (DI) water rinse.

14. The method of claim 11, further comprising removing a portion of the second spacer layer to open the second source/drain region, and epitaxially growing the second semiconductor material in the second source/drain region.

15. The method of claim 10, wherein the first FET includes a pFET and the second FET includes an nFET.

* * * * *